United States Patent [19]

Clementi et al.

[11] Patent Number: 4,681,654

[45] Date of Patent: Jul. 21, 1987

[54] FLEXIBLE FILM SEMICONDUCTOR CHIP CARRIER

[75] Inventors: Robert J. Clementi, Binghamton; Charles E. Gazdik, Endicott; William Lafer, Chenango Bridge; Roy L. Lovesky, Vestal; Donald G. McBride, Binghamton; Joel V. Munson, Port Crane; Eugene P. Skarvinko, Binghamton, all of N.Y.

[73] Assignee: International Business Machines Corporation, Armonk, N.Y.

[21] Appl. No.: 865,316

[22] Filed: May 21, 1986

[51] Int. Cl.[4] .............................. C23F 1/02; B44C 1/22; B29C 37/00; C03C 15/00

[52] U.S. Cl. ........................................ 156/630; 29/591; 29/827; 29/846; 156/633; 156/634; 156/643; 156/644; 156/652; 156/655; 156/656; 156/668; 156/902; 174/68.5; 361/398; 361/403; 428/601

[58] Field of Search ............... 156/630, 633, 634, 643, 156/644, 652, 655, 656, 659.1, 664, 666, 668, 901, 902; 428/601; 174/68.5; 361/398, 403, 404, 421; 29/591, 827, 846; 357/70, 71

[56] References Cited

U.S. PATENT DOCUMENTS

| | | | |
|---|---|---|---|
| 3,440,027 | 4/1969 | Hugle | 174/68.5 X |
| 3,689,991 | 9/1972 | Aird | 29/577 |
| 3,968,563 | 7/1976 | Hamlin | 29/591 |
| 4,063,993 | 12/1977 | Burns | 156/659.1 |
| 4,222,516 | 9/1980 | Badet et al. | |
| 4,231,154 | 11/1980 | Gazdik et al. | 29/840 |
| 4,251,852 | 2/1981 | Ecker et al. | 361/386 |
| 4,377,316 | 3/1983 | Ecker et al. | 339/17 CF |
| 4,386,116 | 5/1983 | Nair et al. | 427/99 |
| 4,480,288 | 10/1984 | Gazdik et al. | 361/398 |
| 4,517,051 | 5/1985 | Gazdik et al. | 156/644 |
| 4,549,200 | 10/1985 | Ecker et al. | 357/80 |

FOREIGN PATENT DOCUMENTS

| | | |
|---|---|---|
| 51-054268 | 5/1976 | Japan . |
| 53-061661 | 6/1978 | Japan . |
| 53-149764 | 12/1978 | Japan . |

OTHER PUBLICATIONS

Gazdik, C. E., et al., "Processing PC Conductor Decals", *IBM Technical Disclosure Bulletin*, vol. 21, No. 11, Apr. 1979, p. 4425, (IBM Corp., Armonk, N.Y. 10504).

Egitto, F. D., et al., "Plasma Etching of Organic Materials.I.Polyimide in $O_2-CF_4$", *J. Vac. Sci. Technology*, B 3 (3), May/Jun. 1985, pp. 893–904.

Primary Examiner—William A. Powell
Attorney, Agent, or Firm—David L. Adour

[57] ABSTRACT

A method is disclosed for making circuitized, flexible film substrates in a continuous tape format using a transfer technique. The tape is made with window-like openings having a relatively thin layer of polyimide spanning the openings. The relatively thin layer of polyimide is transferred to the tape from a metal carrier foil, preferably by using a special adhesive system. After the polyimide is transferred to the tape, the polyimide spanning the window-like openings in the tape is circuitized to form individual, circuitized, flexible film substrates which may be handled in the tape format for further processing. Preferably, the tape includes perforations for engaging sprockets of automated manufacturing equipment, or the like.

19 Claims, 6 Drawing Figures

FLEXIBLE FILM SEMICONDUCTOR CHIP CARRIER

BACKGROUND OF THE INVENTION

The present invention relates to electronic packaging, and more particularly relates to circuitized substrates which may be used to carry semiconductor chips, or other such electronic devices.

Typically, semiconductor chips are mounted on circuitized substrates, known as semiconductor chip carriers, having electrical circuit lines for connecting the chip to a printed circuit board, or other such structure, which may be used as part of a computer, or other such equipment. There are many important considerations in selecting a suitable semiconductor chip carrier for a particular application. For example, an important consideration may be the ability of the semiconductor chip carrier to relieve thermal strains during manufacture and use of equipment incorporating a semiconductor chip, the semiconductor chip carrier, and a printed circuit board, each having a different coefficient of thermal expansion. Another consideration may be the ability to manufacture the semiconductor chip carrier in a form suitable for use in a relatively high volume, manufacturing environment. A further consideration may be the ability of the semiconductor chip carrier to support relatively fine circuit lines. A still further consideration may be the ability to mount a semiconductor chip on the semiconductor chip carrier using an area or peripiheral array attachment configuration. The foregoing are examples of just some of the considerations that may be important for selecting a semiconductor chip carrier for use in a particular application.

Of course, there are a number of known semiconductor chip carriers, and other such circuitized substrates, designed for use in particular applications. Such substrates include metallized ceramic, and circuitized, flexible film substrates as described in U.S. Pat. Nos. 4,517,051, 4,480,288, and 4,231,154. However, there are many other applications requiring circuitized substrates having other features and advantages. For example, there is a need to provide circuitized substrates having relatively fine circuit lines to which semiconductor chip may be connected in an array or peripheral area configuration. In addition, there is an especially important need for circuitized, flexible film substrates which may be manufactured in a form suitable for use in a relatively high volume, manufacturing environment, and/or in a form suitable for use with automated manufacturing equipment.

SUMMARY OF THE INVENTION

Therefore, an object of the present invention is to provide a circuitized, flexible film substrate having relatively fine circuit lines to which a semiconductor chip may be connected in an array or peripheral area configuration.

Another object of the present invention is to provide a method for making such a circuitized, flexible film substrate in a relatively high volume, manufacturing environment.

A further object of the present invention is to provide a method for making such a circuitized, flexible film substrate with automated manufacturing equipment.

These and other objects of the present invention are attained by making circuitized, flexible film substrates in a continuous tape format using a transfer technique. The tape is made with window-like openings having a relatively thin layer of polyimide spanning the openings. The relatively thin layer of polyimide is transferred to the tape from a metal carrier foil, preferably by using a special adhesive system of uncured polyimides. After the polyimide is transferred to the tape, the polyimide spanning the window-like openings in the tape is circuitized to form individual, circuitized, flexible film substrates which may be handled in the tape format for further processing. Preferably, the tape includes perforations for engaging sprockets of automated manufacturing equipment, or the like.

BRIEF DESCRIPTION OF THE DRAWING

Other objects and advantages of the present invention will be apparent from the following description in conjunction with the accompanying drawing, in which like reference numerals represent like elements, and in which.

DESCRIPTION OF THE PREFERRED EMBODIMENT

Figure 1:
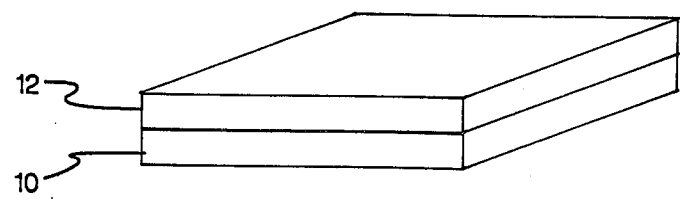
FIG. 1 is a perspective view of a portion of a length of metal carrier foil coated with a layer of polyimide for use in making circuitized, flexible film substrates according to the principles of the subject invention.

Referring to FIG. 1, a perspective view is shown of a portion of a length of metal carrier foil 10 coated with a layer of polyimide 12 for use in making circuitized, flexible film substrates according to the principles of the subject invention. Preferably, the metal carrier foil 10 is made of aluminum or copper having a thickness of approximately 25 to 127 microns (about 0.001 to 0.005 inch), a width selected based on the type of product which it is desired to manufacture, and a length selected based on the type of equipment chosen to handle the foil 10. For example, for a typical semiconductor chip carrier product, the foil 10 may have a thickness of approximately 38 microns (about 0.0015 inch), a width of approximately 35 millimeters (about 1.365 inches), and a length of approximately 122 meters (about 400 feet). However, depending on the particular application, it may be desirable to use a foil 10 having a width anywhere between approximately 2.56 centimeters (about one inch) and 0.92 meter (about three feet), and having a length anywhere between 0.3 meter (about 1 foot) and several hundred meters (several hundred feet). Also, it should be noted that although, preferably, the foil 10 is made of aluminum or copper, the foil may be made of stainless steel, or any other such suitable material.

Preferably, the polyimide layer 12 comprises a thermo set condensation polymer polyimide, which in an uncured (unimidized), liquid form, is coated on the carrier foil 10 using a conventional continuous spray, roller coater, or squeeegy type application technique. However, any other suitable technique for coating the polyimide on the carrier foil 10 may be used, if desired.

Preferably, the polyimide layer 12 is relatively thin. For example, the polyimide layer 12 may have a thickness between approximately 5.1 microns (about 0.0002 inch) and 7.6 microns (about 0.0003 inch). For most applications, the polyimide layer 12 should have a thickness less than 12.7 microns (about 0.0005 inch). However, the polyimide layer 12 should not be so thin that it loses its structural integrity, such that the polyimide layer 12 cannot function as a structurally continuous dielectric layer. For some applications, it may be desirable for the polyimide layer 12 to have a thickness between approximately 12.7 microns (about 0.0005 inch) and 25 microns (about 0.001 inch). However, for thermal expansion reasons discussed below, it is preferred that the polyimide layer 12 not have a thickness greater than approximately 25 microns (about 0.001 inch).

Any one of a number of specific materials may be used to form the polyimide layer 12. For example, "5878" polyimide (PMDA-ODA type) available from E. I. Du Pont de Nemours and Company having a place of business at 1007 Market Street, Wilmington, Del., may be used. This "5878" polyimide is a thermo set condensation polymer polyimide, which is basically a high temperature, elastic material. That is, it is capable of withstanding processing temperatures up to approximately 400 degrees Celsius, any may be stetched. However, it should be noted that, if desired, other kinds of materials may be used as the polyimide layer 12. For example, a thermo plastic non-condensation polymer polyimide, such as "XU-218" polyimide available from Ciba-Geigy Corporation having a place of business at Ardsley, N.Y., may be used as the polyimide layer 12. This "XU-218" polyimide is fully imidized, and is also basically a high temperature, elastic material like the "5878" polyimide. Also, it should be noted that depending on the product which it is desired to produce, the application for that product, and other such factors, it may be desirable to use materials other than polyimide to form the relatively thin layer 12.

However, as mentioned previously, preferably the polyimide layer 12 comprises a thermo set condensation polymer polyimide, such as "5878" polyimide, which is coated on the carrier foil 10 in an uncured (unimidized), liquid form. After this liquid polyimide is coated on the metal carrier foil 10, the polyimide is dried to partially cure (partially imidize) the polyimide to an "A" stage, such that less than approximately 50% of the polyimide is imidized and the polyimide is non-tacky (dry to the touch). The polyimide may be dried using means such as an infrared heater, convection oven, microwave oven, or other such heating equipment. For example, if the polyimide layer 12 is to be a 5 micron (about 0.0002 inch) to 7.6 micron (about 0.0003 inch) thick layer of "5878" polyimide then the liquid polyimide may be dried to the "A" stage by heating with an infrared heater for about 45 minutes at a temperature of about 120 degrees Celsius.

Figure 2:
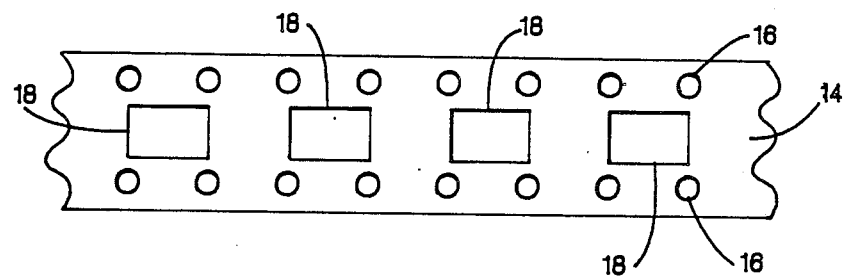
FIG. 2 is a top view of a section of a length of tape, having perforations along each edge of the tape for engaging handling equipment sprockets, and having a plurality of centrally located window-like openings, which may be used with the polyimide coated metal carrier foil shown in FIG. 1 to make circuitized, flexible film substrates according to the principles of the subject invention.

Referring to FIG. 2, a top view is shown of a section of a length of tape 14, having perforations 16 along each edge of the tape 14 for engaging handling equipment sprockets (not shown) and having a series of centrally located window-like openings 18, which may be used with the polyimide coated metal carrier foil 10 shown in FIG. 1 to make circuitized, flexible film substrates according to the principles of the subject invention. Preferably, the tape 14 is made of a relatively high temperature, chemically resistant, thick film material between approximately 51 microns (about 0.002 inch) and 178 microns (about 0.007 inch). That is, preferably, the tape is made of a material capable of withstanding processing temperatures up to approximately 400 degrees Celsius, and capable of withstanding process chemicals of the type described hereinafter for use in making the circuitized, flexible film substrates according to the principles of the subject invention. For example, the tape 14 may be made of a polyimide material sold under the trademark "KAPTON" by E. I. Du Pont de Nemours and Company having a place of business at 1007 Market Street, Wilmington, Del. However, it should be noted that the tape 14 generally may have any thickness as long as it can be handled as desired (preferably in a flexible, continuous tape format), and may be made of other materials such as stainless steel, aluminum, copper, or other such metals, or polysulfone.

Preferably, the tape 14 has about the same length as the carrier foil 10, and a width which is somewhat larger than the width of the carrier foil 10. For example, if the carrier foil 10 has a width of approximately 35 millimeters (about 1.365 inches), and a length of approximately 122 meters (about 400 feet). Then, preferably, the tape 14 has about the same length, and a width which is approximately 6.4 millimeters (about one-fourth inch) larger than the width of the carrier foil 10. This facilitates transfer of the polyimide layer 12 from the carrier foil 10 to the tape 14 as described hereinafter.

Any suitable means may be used to form the perforations 16 and the window-like openings 18 in the tape 14. For example, the perforations 16 and openings 18 may be punched in the tape 14. The size and shape of the window-like openings 18 are selected based on the size and shape of the circuitized, flexible film substrates which it is desired to manufacture according to the principles of the subject invention. For example, if it is desired to manufacture 2.56 centimeters (about one inch) square circuitized, flexible film substrates, then the openings 18 are 2.56 centimeters (about one inch) square openings. The size and shape of the perforations 16 are selected to facilitate engaging the sprockets of automated handling equipment (not shown) which may be used to handle the tape 14.

Preferably, a relatively high temperature (capable of withstanding processing temperatures up to approximately 400 degrees Celsius), adhesive material is applied to at least one side of the tape 14. For example, if the polyimide layer 12 on the carrier foil 10 comprises a thermo set condensation polymer polyimide, such as the Du Pont "5878" polyimide dried to an "A" stage as described above, or a fully imidized polyimide, such as the Ciba-Geigy "XU-218" polyimide described above, and the tape 14 is made of the Du Pont "KAPTON" polyimide, then the adhesive material on the tape 14 may comprise a thermo plastic non-condensation polymer polyimide, such as the Ciba-Geigy "XU-218" polyimide, to facilitate transfer of the polyimide layer 12 from the carrier foil 10 the tape 14 as described hereinafter. Alternatively, if the polyimide layer 12 on the carrier foil 10 comprises a thermo set condensation polymer polyimide, such as the Du Pont "5878" polyimide dried to an "A" stage as described above, and the tape 14 is made of stainless steel, then the adhesive material on the tape 14 may comprise this same "5878" polyimide dried to a "B" stage, wherein less than approximately 70% of the polyimide is imidized. However, it should be noted that use of the "XU-218" polyimide as the adhesive material on the tape 14 in combination with use of the "A" stage "5878" polyimide as the polyimide layer 12 on the carrier foil 10, has been found to provide an unexpected and surprisingly good, relatively high temperature adhesive system for facilitating the transfer of the polyimide layer 12 from the carrier foil 10 to the tape 14 as described in detail hereinafter. Also, it should be noted that if the tape 14 will not be subjected to relatively high processing temperatures then it may be possible to use an expoxy or acrylic adhesive on the tape 14.

The adhesive material may be applied to the tape 14 using any one of a number of different methods depending on the properties of the particular adhesive material which it is desired to apply to the tape 14. For example, the fully imidized Ciba-Geigy "XU-218" polyimide may be pre-formed into an approximately 25 microns (about 0.001 inch) thick film having approximately the same length and width as the tape 14, and then laminated to the tape 14 using a continuous roll lamination technique. Alternatively, the "XU-218" polyimide may be applied in liquid form to the tape 14 and then dried. For example, if a 12.7 microns (about 0.0005 inch) thick layer of "XU-218" polyimide is to be coated on the tape 14, then the "XU-218" polyimide in liquid form may be applied to the tape 14 using a conventional continuous spray, roller coater, or squeegy type application technique of the same kind as mentioned previously for coating the uncured, liquid "5878" polyimide on the carrier foil 10, and then dried for about 90 minutes at a temperature of about 150 degrees Celsius using means such as an infrared heater, convection oven, microwave oven, or other such heating equipment, of the same kind as mentioned previously for drying the "5878" polyimide on the carrier foil 10.

If the Du Pont "5878" polyimide is used as the adhesive material on a stainless steel tape 14, it may be applied to the tape 14 in an uncured (unimidized), liquid form, using a conventional continuous spray, roller coater, or squeegy type application technique of the same kind as mentioned previously for coating the uncured, liquid "5878" polyimide on the carrier foil 10. Then, the "5878" polyimide on the tape 14 may be dried to partially cure (partially imidize) it to the "B" stage using means such as an infrared heater, convection oven, microwave oven, or other such heating equipment, of the same kind as mentioned previously for drying the "5878" polyimide on the carrier foil 10. For example, if it is desired to place a 12.7 microns (about 0.0005 inch) thick ashesive layer of "5878" polyimide on the tape 14, then this "5878" polyimide may be applied in an uncured, liquid form to the tape 14, and then dried to the "B" stage by heating with an infrared heater for approximately thirty minutes at a temperature of approximately two-hundred degrees Celsius.

Figure 3:
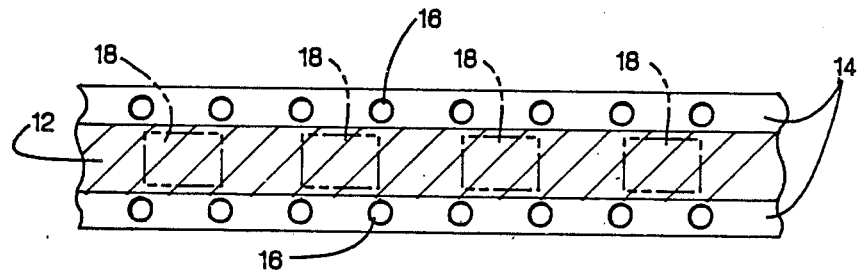
FIG. 3 is a top view of the tape shown in FIG. 2 after the polyimide layer from the metal carrier foil shown in FIG. 1 has been transferred to the tape according to the principles of the subject invention.

Referring to FIG. 3, a top view is shown of the tape 14 after the polyimide layer 12 from the metal carrier foil 10, shown in FIG. 1, has been transferred to the tape 14 according to the principles of the subject invention. Preferably, as depicted in FIG. 3, the tape 14 is wider than the polyimide layer 12 transferred to the tape 14 to allow relatively easy handling of the tape 14 using equipment with sprockets for engaging the perforations 16 along the edges of the tape 14.

However, as will be readily apparent to one of ordinary skill in the art to which the subject invention pertains, the best configuration for the tape 14 with polyimide layer 12 will, to a large extend, depend on the particular type of equipment which it is desired to use in handling the tape 14.

Preferably, the polyimide layer 12 is transferred from the metal carrier foil 10 to the tape 14 by laminating the polyimide coated side of the carrier foil 10 to the adhesive coated side of the tape 14, and then removing the carrier foil 10. For example, if the carrier foil 10 is 38 microns (about 0.0015 inch) thick aluminum coated with a 5 micron (about 0.0002 inch) to 7.6 microns (about 0.0003 inch) thick layer 12 of Du Pont "5878" polyimide dried to the "A" stage, and the tape 14 is made of 51 microns (about 0.002 inch) to 178 microns (about 0.007 inch) thick Du Pont "KAPTON" polyimide having a 12.7 microns (0.0005 inch) thick layer of Ciba-Geigy "XU-218" polyimide as the adhesive material, then these may be laminated together by pressing the polyimide coated side of the carrier foil 10 against the adhesive coated side of the tape 14 with a pressure of approximately 69 to 138 newtons per square centimeter (about one-hundred to two-hundred pounds per square inch) for approximately thirty minutes at a temperature of approximately three-hundred forty degrees Celsius. This lamination process may be carried out using a continuous roll lamination technique. For example, it may be possible to use a continuous roll laminator available from Sandvik Process Systems, Inc. having a place of business at 333 East 7th Avenue, York, Pa., for carrying out this lamination process.

As mentioned previously, use of the "XU-218" polyimide as the adhesive material on the tape 14 in combination with use of the "A" stage "5878" polyimide as the polyimide layer 12 on the carrier foil 10, has been found to provide an unexpected and surprisingly good, relatively high temperature adhesive system for facilitating the transfer of the polyimide layer 12 from the carrier foil 10 to the tape 14 using the lamination process described above. More specifically, the "XU-218" polyimide has a recommended lamination temperature of 340 degrees Celsius, and the "5878" polyimide is not recommended to be laminated in an uncured state because its cure cycle involves a condensation reation giving off water which may cause blisters in the resulting laminate. However, notwithstanding the foregoing, using the above described "adhesive system" of "XU-218" polyimide and uncured ("A" stage) "5878" polyimide and the above described processing conditions, a blister free product with high temperature capability is obtainable at a lamination temperature much lower than might be expected. One of the unique features of this adhesive system is that a thermo plastic non-condensation polymer polyimide (the "XU-218" polyimide) is bonded to a thermo set condensation polymer polyimide (the "5878" polyimide). Apparently, the interdiffusion of these two materials yields a relatively high temperature (up to four-hundred degrees Celsius) adhesive system which may otherwise be difficult to obtain.

However, it should be noted that other techniques may be caused to transfer the polyimide layer 12 from the carrier foil 10 to the tape 14. For example, as indicated previously, use of the "B" stage "5878" polyimide as the adhesive material on the tape 14 made of stainless steel, in combination with use of the "A" stage "5878" polyimide as the polyimide layer 12 on the carrier foil 10, will also provide an adhesive system for transferring a polyimide layer 12 from the carrier foil 10 to the tape 14 using a lamination process. However, this technique is not preferred because the tape 14 must be made of a metal, such as stainless steel, which places limitations on the kinds of processing chemicals which may be subsequently used to form circuitry on the polyimide layer 12 as described hereinafter.

After the polyimide coated carrier foil 10 has been laminated to the adhesive coated tape 14, then the carrier foil 10 is removed leaving the relatively thin, preferably between approximately 5.1 microns to 7.6 microns (about 0.0002 to 0.0003 inch), polyimide layer 12 on the tape 14 with the polyimide layer 12 spanning the centrally located window-like openings 18 in the tape 14. The carrier foil 10 may be removed by a conventional etching process, or by using any other such suitable process. For example, if the carrier foil 10 is aluminum, then the foil 10 may be etched away in a solution comprising water and approximately 20% by volume hydrochloric acid (HCl), or in a pure HCl solution. If the carrier foil 10 is copper, then the foil 10 may be etched away using a solution comprising water and approximately 370 grams per liter ferric chloride (FeCl3).

After the carrier foil 10 has been removed, then the polyimide layer 12 on the tape 14 is fully cured (fully imidized) to a "C" stage, such that approximately 100% of the polyimide is imidized. This curing process results in the polyimide layer 12 forming a drum head like structure over each of the window-like openings 18 in the tape 14. This drum head like structure provides a taut, planar surface on which circuitry may be formed as described hereinafter. For example, if the polyimide layer 21 transferred from the carrier foil 10 to the tape 14, comprises a 5.1 micron to 7.6 micron (about 0.0002 to 0.0003 inch) thick layer of "A" stage "5878" polyimide, then this polyimide layer 12 may be fully cured by heating at a temperature of approximately 360 to 400 degrees Celsius for approximately 30 minutes thereby forming the desired drum head like structure of polyimide spanning each of the window-like openings 18 in the tape 14.

Figure 4:
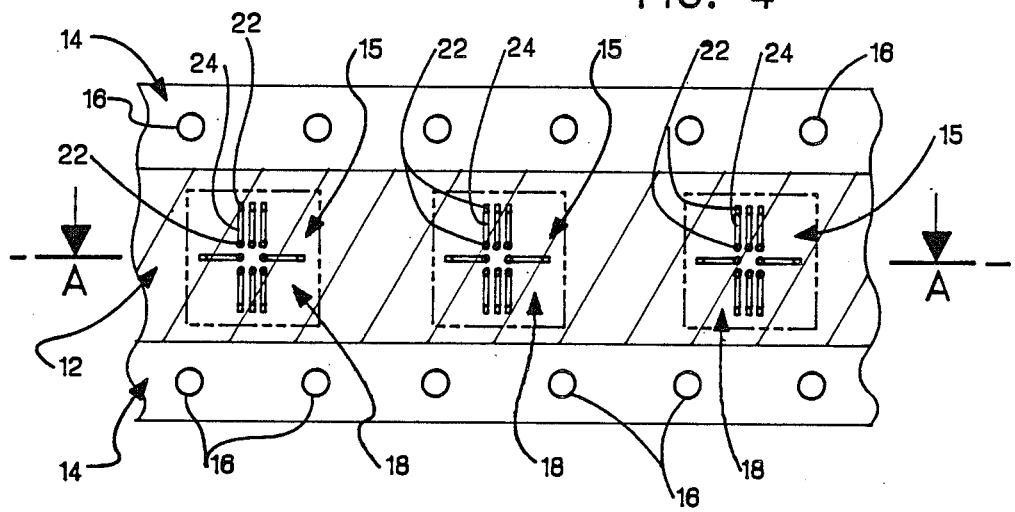
FIG. 4 is a top view of a section of the length of tape shown in FIG. 2 after the polyimide layer from the metal carrier foil shown in FIG. 1 has been transferred to the tape and a single layer of circuitry has been formed on the polyimide layer spanning the centrally located window-like openings in the tape, according to the principles of the subject invention.
Figure 5:
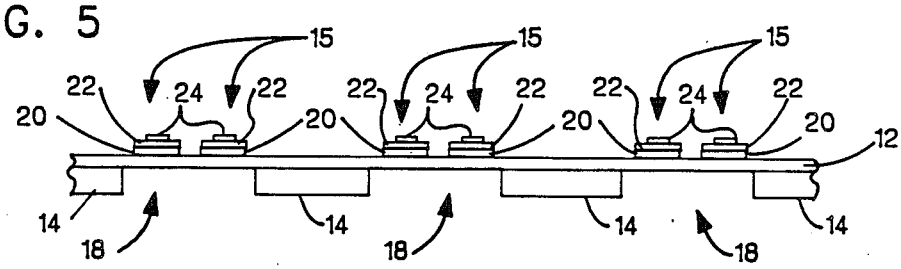
FIG. 5 is a cross sectional view along the line A—A of the section of the length of tap shown in FIG. 4.

Referring to FIG. 4, a top view is shown of a section of the length of tape shown in FIG. 2 after the polyimide layer 12 from the metal carrier foil 10 shown in FIG. 1 has been transferred to the tape 14 and a single layer of circuitry 15 has been formed on the polyimide layer 12 spanning the centrally located window-like openings 18 in the tape 14, according to the principles of the subject invention. FIG. 5 shows a cross sectional view along the line A—A of the section of the length of the tape 14 show in FIG. 4. Preferably, as shown in FIGS. 4 and 5, for ease in manufacture, the circuitry 15 is formed on the surface of the polyimide layer 12 facing away from the window-like openings 18 in the tape 14. However, if desired, by working within the wells formed by side walls of the tape 14 defining the window-like openings 18, the circuitry 15 may be formed on the surface of the polyimide layer 12 facing toward the window-like openings 18 in the tape 14.

The single layer of circuitry 15 on the polyimide layer 12 may be formed by any suitable process. For example, as shown in FIGS. 4 and 5, the circuitry 15 may be formed by blanket metallizing the polyimide layer 12 with successive layers of chromium 20, copper 22, and chromium 24 (Cr-Cu-Cr), or other such suitable metallurgical system, followed by conventional photolithographic and etching techniques to provide a desired circuit pattern on the polyamide layer 12. The blanket metallization may be performed using, for example, a conventional evaporation or sputtering technique. Alternatively, the blanket metallization may be provided by first using a conventional evaporation or sputtering technique to provide a relatively thin layer of metal on the polyimide layer 12, followed by building up the full thickness of desired metallization using conventional electroplating techniques.

As depicted in FIGS. 4 and 5, the bottom layer of chromium 20 promotes adhesion of the circuitry 15 to the underlying polyimide layer 12, while the copper layer 22 forms the bulk of the circuit lines, and the top layer of chromium 24 is selectively etched away to provide lands and pads for attachment of electronic devices, such as semiconductor chips, to the circuitry 15, and for attachment of the circuitry 15 on the polyimide layer 12 to other structures, such as printed circuit boards or the like, as further described below. Preferably, the exposed copper 22 of the circuitry 15 forming the lands and pads is plated with gold, or tinned, to protect the copper 22 and to facilitate the attachment of the circuitry 15 to devices and structures of the type previously mentioned. It should be noted that since the polyimide layer 12 is continuous, the circuitry 15, including the lands and pads, may be formed in virtually any desired pattern on the polyimide layer 12. Thus, the circuitry 15 on the polyimide layer 12 may be tailored to accommodate virtually any device or structure which it is desired to attach to the circuitry 15. For example, as shown in FIGS. 4 and 5, the circuitry 15 may be formed with controlled collapse chip connection (C-4) pads in an area array configuration suitable for area array C-4 attachment of a semiconductor chip to the C-4 pads of the circuitry 15.

Preferably, the circuitry 15 formed on the polyimide layer 12 is relatively fine line circuitry with individual circuit lines having a thickness of approximately 7.6 microns (0.0003 inch) and a width of approximately 25.4 microns (about 0.001 inch). However, it should be noted that the thickness and width of the circuit lines may vary depending on factors such as the capabilities of the process used to form the circuitry 15 on the polyimide layer 12, the planned use for the circuitry 15, and the performance characteristics expected of the circuitry 15 and of the resulting circuitized, polyimide flexible film substrate. Also, it should be noted that, especially with respect to the circuitry 15 shown in FIGS. 4 and 5, for ease of illustration, there has been no attempt to draw the structures shown in the Figures to scale.

Preferably, as depicted in FIGS. 4 and 5, a separate circuit pattern is formed on each drum head area of the polyimide layer 12 spanning each window-like opening 18 in the tape 14, to form a series of discrete, circuitized polyimide flexible film substrates on the tape 14 which may be used in any one of a variety of applications. For example, each of these separate circuit patterns on the polyimide layer 12 may have lands, pads, and/or other such areas, tailored to accommodate a semiconductor chip, or other such electronic device, which it may be desired to electrically and physically connect (mount) to the circuitry 15 on the polyimide layer 12. As discussed previously, the perforations 16 (see FIGS. 2 and 3) in the tape 14 make it relatively easy to handle the tape 14 in a continuous tape format using automated manufacturing equipment having sprockets designed to engage the perforations 16 in the tape 14. Thus, the semiconductor chips, or other such electronic devices, may be mounted on the circuitry 15 using automated manufacturing equipment suitable for use in a relatively high volume manufacturing environment. Of course, if desired, the semiconductor chips, or other such electronic devices, may be manually mounted on the circuitry 15 using equipment such as a microscope, or other suitable means may be used to mount the semiconductor chips, or other such electronic devices, on the circuitry 15. Once the semiconductor chips, or other such electronic devices, have been mounted on the circuitry 15, then each of the circuitized, flexible film polyimide substrates may be cut out of, or otherwise removed from, the tape 14, and mounted on a printed circuit board, or other such structure, by using a solder reflow, ultrasonic bonding, thermal compression bonding, or other such technique. Alternatively, depending on the application, it may be possible to first mount the circuitized flexible polyimide film substrate (with chip, or device, already attached to the substrate) to the circuit board, or other such structure, and then remove it from the tape 14. Still further, when cutting out the circuitized flexible film substrate from the tape 14, it may be possible to cut out a portion of the tape 14 surrounding the circuitized flexible polyimide film substrate to provide a frame for the substrate which may assist in mounting the substrate on the circuit board, or other such structure.

Of course, one important advantage of using the circuitized polyimide flexible film substrate described above as a carrier for a semiconductor chip, or other such electronic device, is the ability of the substrate to relieve thermal stresses and strains when the substrate is used as an electronic package to electronically and physically connect the semiconductor chip to a printed circuit board, or other such structure having a different coefficient of thermal expansion than the semiconductor chip. Since the circuitized polyimide substrate is relatively thin, preferably approximately 5.1 microns to 7.6 microns (about 0.0002 to 0.0003 inch) as discussed above, it compensates for thermal stresses and strains which might otherwise damage the electrical and physical connections between the semiconductor chip and the printed circuit board, or other such structure, while providing a reliable electronic package with circuitry for connecting the semiconductor chip to circuitry on the printed circuit board, or other such structure.

Figure 6:
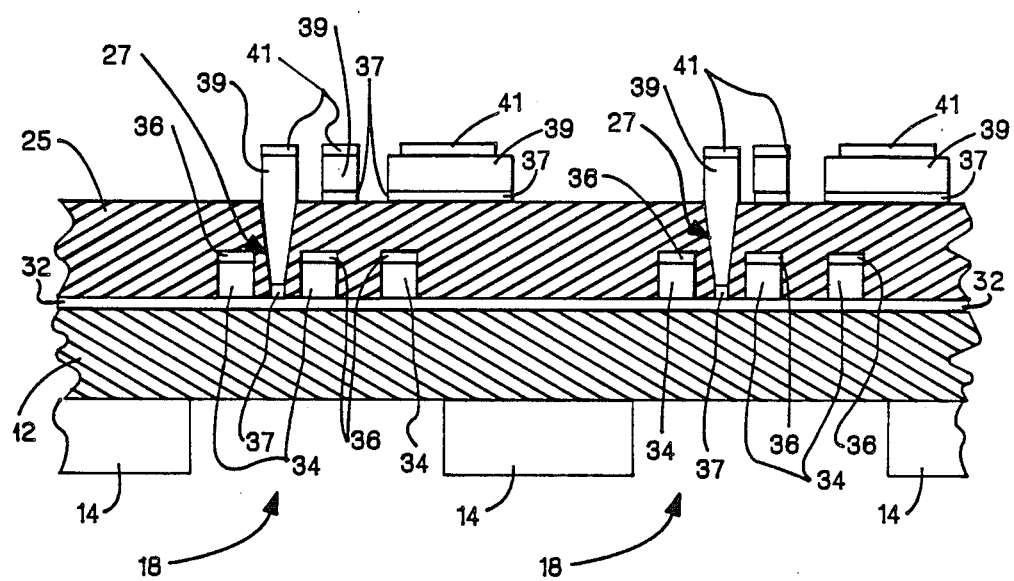
FIG. 6 is a cross sectional view of a section of the tape shown in FIG. 2 after the polyimide layer from the metal carrier foil shown in FIG. 1 has been transferred to the tape and two layers of circuitry have been formed on opposite sides of a second layer of polyimide applied to the tape, according to the principles of the subject invention.

Referring to FIG. 6, a cross sectional view is shown of a section of the tape 14 shown in FIG. 2 after the polyimide layer 12 from the metal carrier foil 10 shown in FIG. 1 has been transferred to the tape 14 and two layers of circuitry have been formed on opposite sides of a second layer of polyimide 25 applied to the tape 14, according to the principles of the subject invention. This double layer circuit configuration is an alternative which can provide a circuitized polyimide flexible film substrate with denser circuitry having more performance capabilities than a circuitized polyimide flexible film substrate with a single layer of circuitry 15 as shown and discussed above with respect to FIGS. 4 and 5. Preferably, each of the two layers of circuitry shown in FIG. 6 is relatively fine line circuitry with individual circuit lines having a thickness of approximately 7.6 microns (about 0.0003 inch) and a width of approximately 25.4 microns (about 0.001 inch), just as mentioned previously for the single layer of circuitry 15 shown and discussed above with respect to FIGS. 4 and 5.

Preferably, as shown in FIG. 6, each of the two layers of circuitry is formed using chromium-copper-chromium metallurgy, or other such suitable metallurgy, and essentially the same process as discussed above for forming the single layer of circuitry 15. That is, first, blanket layers of chromium-copper-chromium (Cr-Cu-Cr) are successively deposited on the polyimide layer 12 using, for example, a conventional evaporation or sputtering technique. For example, a first bottom layer 32 of Cr may be deposited having a thickness somewhere between approximately 150 and 800 angstroms, followed by a first layer 34 of Cu having a thickness somewhere between approximately 80,000 and 90,000 angstroms, and a first, top layer 36 of Cr having a thickness of approximately 800 angstroms. Then, a blanket layer of photoresist, such as "KTFR" photoresist available from Eastman Kodak Company having a place of business at 343 State Street, Rochester, N.Y., is applied to the top layer 36 of Cr by a conventional spraying technique, or by any other suitable technique. For example, a three to four micron thick layer of "KTFR" photoresist may be applied. This blanket layer of photoresist is exposed to light using a projection printer, or other such equipment, having means, such as a glass master, for projecting the light onto the photoresist in a desired pattern corresponding to the circuit pattern it is desired to form from the underlying blanket metallurgy. It should be noted that the photoresist may be a positive or a negative photoresist.

After the photoresist has been exposed to the light to polymerize the photoresist in the desired circuit pattern, then the photoresist is developed by passing the tape 14 through a suitable photoresist developer. For example, "KTFR" photoresist may be developed in a solution of methylchloroform freon to remove the photoresist covering the metallurgy which it is desired to further process to leave a desired circuit pattern. After the photoresist has been developed, the exposed top layer 36 of Cr and underlying layer 34 of Cu are removed using suitable etchants. For example, the exposed top layer 36 of Cr may be removed by etching in a potassium permanganate (KMnO4/KOH) solution, and the underlying layer 34 of copper may be removed by etching in a ferric chloride (FeCl2/HCl) solution, thereby leaving the bottom layer 32 of Cr intact. After this circuit personalization process, all of the photoresist is then stripped away using a suitable photoresist stripper. For example, "J-100" photoresist stripper available from the Philip A. Hunt Company having a place of business at Roosevelt Place, Palisades Park, N.J., may be used to strip away "KTFR" photoresist.

After the first layer of circuitry has been formed on the polyimide layer 12 as described above, then the second layer of polyimide 25 is applied to this circuitry as shown in FIG. 6. Preferably, the second layer of polyimide 25 is essentially identical to the first layer of polyimide 12. That is, the second layer of polyimide 25 is a relatively thin layer of, for example, "5878" polyimide, which in an uncured (unimidized), liquid form, is coated on the first layer of circuitry using a conventional spray, roller coater, or squeegy type application technique as described above for forming the polyimide layer 12 on the metal carrier foil 10. Preferably, the polyimide layer 25 has a thickness between approximately 5.1 microns to 7.6 microns (about 0.0002 to 0.0003 inch), just like the polyimide layer 12.

Still referring to FIG. 6, after the second polyimide layer 25 has been applied in an uncured, liquid form to the first layer of circuitry on the polyimide layer 12 as described above, then the second polyimide layer 25 is dried to partially cure it to the "A" stage using means such as an infrared heater, convection oven, microwave oven, or other such heating equipment, of the same kind as mentioned previously for drying the "5878" polyimide on the carrier foil 10. For example, a polyimide layer 25 having a thickness between approximately 5.1 to 12.7 microns (about 0.0002 to 0.0003 inch), may be provided by applying uncured, liquid "5878" polyimide to the first layer of circuitry on the polyimide layer 12, then drying this polyimide layer 25 to the "A" stage by heating with an infrared heater for about thirty minutes at a temperature of about one-hundred twenty degrees Celsius. Vias (openings) 27 in selected locations are then formed in the "A" stage polyimide layer 25 using any one of a number of techniques. For example, a photoresist process just like that described above for forming the first layer of circuitry on the polyimide layer 12 may be used to define the vias 27 in the polyimide layer 25. Then, the vias 27 in the polyimide layer 25 may be etched with potassium hydroxide (KOH) or tri methyl ammonium hydroxide. After the vias 27 in the polyimide layer 25 have been etched, then all of the remaining photoresist may be stripped away using a suitable photoresist stripper. For example, as mentioned previously, "J-100" photoresist stripper may be used to strip away "KTFR" photoresist.

After the vias 27 have been formed in the polyimide layer 25, then the polyimide layer 25 is fully cured (fully imidized) to the "C" stage, such that approximately 100% of the polyimide is imidized. For example, a polyimide layer 25 having a thickness between approximately 5.1 microns and 7.6 microns (about 0.0002 and 0.0003 inch) may be provided by applying uncured, liquid "5878" polyimide to the first layer of circuitry on the polyimide layer 12, then drying this polyimide layer 25 to the "A" stage by as described above, then the polyimide layer 25 may be fully cured to the "C" stage by heating at about four-hundred degrees Celsius for about thirty minutes. The polyimide layer 25 is fully cured to the "C" stage only after formation of the vias 27 in the polyimide layer 25 since this facilitates formation of the vias 27 in the polyimide layer 25 by processes such as the photoresist process mentioned above. More specifically, the vias 27 in the polyimide layer 25 are more difficult to etch when the polyimide is fully cured to the "C" stage than when the polyimide is only partially cured to the "A" stage.

Still referring to FIG. 6, after the vias 27 have been formed in the polyimide layer 25 and the polyimide layer 25 has been fully cured to the "C" stage, then a second layer of circuitry is formed on top of the polyimide layer 25. Preferably, as mentioned previously, this second layer of circuitry is formed using chromium-copper-chromium metallurgy, or other such suitable metallurgy, and essentially the same photoresist and etching processes as described above for forming the first layer of circuitry on the polyimide layer 12. As shown in FIG. 6, each of the circuit lines forming this second layer of circuitry comprises a bottom layer 37 of Cr, provided, in part, to promote adhesion of the circuitry to the underlying polyimide layer 25, a layer 39 of Cu which forms the bulk of each of the circuit lines, and a top layer 41 of Cr which protects the underlying Cu forming the bulk of each circuit line. As shown in FIG. 6, this Cr-Cu-Cr metallurgy fills in the vias 27 to provide electrical paths (interconnections) between the circuitry formed on the opposite sides of the polyimide layer 25. However, it should be noted that, as shown in FIG. 6, the bottom layer 37 of Cr is completely removed between each of the circuit lines forming this second layer of circuitry. Also, as shown in FIG. 6, the top layer 41 of Cr may be selectively etched away from portions of certain selected circuit lines forming the second layer of circuitry to provide lands and pads for attachment of electronic devices, such as semiconductor chips, to this second layer of circuitry, and/or for attachment of the second layer of circuitry to other structures, such as printed circuit boards, or the like, in essentially the same manner as described above with respect to attachment of devices and stuctures to the single layer of circuitry 15 shown in FIGS. 4 and 5.

Preferably, the top layer 41 of Cr is selectively removed to form the desired lands and pads of the second layer of circuitry by using photoresist and etching processes identical to the photoresist and etching processes used to personalize the blanket metallurgy, that is, to form the circuit lines from the blanket metallurgy, except that only the top layer 41 of Cr is removed from those areas which it is desired to make into the lands and pads. Also, preferably, this lands and pads select process is preformed prior to the process of forming the individual circuit lines (personalizing) of the second layer of circuitry.

After the overlying layers 39 and 41 of Cu and Cr, respectively, have been removed from between each of the circuit lines forming the second layer of circuitry as described above, then the bottom layer 37 of Cr may be removed from between each of the circuit lines by using any suitable etchant in conjunction with the photoresist mask defining the desired second layer of circuitry on the blanket metallurgy. For example, if "KTFR" photoresist is used to provide the photoresist mask defining the circuit lines of the second layer of circuitry, then the bottom layer 37 of Cr may be removed by etching in a potassium permanganate (KMnO4/KOH) solution.

After the first and second layers of circuitry have been formed on opposite sides of the polyimide layer 25 on the tape 14 as shown in FIG. 6, then an appropriate protective layer of material, such as photoresist, (not shown) is applied covering the second layer of circuitry. For example, the protective layer of material may be an approximately 5.1 microns (about 0.0002 inch) thick layer of "KTFR" photoresist. Then, the original, bottom polyimide layer 12 spanning the window-like openings 18 in the tape 14 is removed, for example, by using a plasma etching process such as described in an article by Eggito, et al., entitled "Plasma etching of organic materials. I. Polyimide in O2-CF4", in the Journal of Vacuum Science Technology, B 3 (3), May/June 1985, the entire disclosure of which is incorporated herein by reference. It is necessary to use such a plasma etching process to remove the polyimide layer 12 spanning the window-like openings in the tape 14 since, as described previously, this polyimide layer 12 has been dried to fully cure the polyimide to the "C" stage, and it may be difficult to remove this fully cured polyimide layer 12 without using such a plasma etching process. The "KTFR" photoresist covering the second layer of circuitry protects the polyimide layer 25 during the process of removing the polyimide layer 12 spanning the window-like openings 18 in the tape 14.

After the polyimide layer 12 spanning the window-like openings 18 in the tape 14 is removed, then the exposed portions of the first, bottom layer 32 of Cr are removed, for example, by etching in a potassium permanganate (KMnO4/KOH) solution. Then, the protective coating on the second layer of circuitry is removed. For example, if the protective coating is "KTFR" photoresist as mentioned above, then it may be stripped away using a suitable photoresist stripper, such as the "J-100" photoresist stripper also mentioned above.

Once the protective coating on the second layer of circuitry has been removed as described above, this leaves just the desired polyimide flexible film, two layer circuit structure spanning each of the window-like openings 18 in the tape 14. This structure comprises the second layer of polyimide 25 with circuitry on opposite sides of the polyimide layer 25 as described above, and with the vias 27 in selected locations in the polyimide layer 25 also as described above. This series of discrete, two layer circuitized polyimide flexible film substrates spanning each of the window-like openings 18 in the tape 14 may be used in any one of a variety of applications just like the series of discrete, single layer circuitized polyimide flexible film substrates discussed above and shown in FIGS. 4 and 5. For example, each of these two layer circuitized polyimide flexible film substrates may be cut out and used as a carrier for an electronic device(s), such as semiconductor chip, for use in mounting the device on a structure, such as printed circuit board, or the like. The device may be mounted on either side of the polyimide layer 25 since, of course, there is circuitry on both sides of the polyimide layer 25. Thus, this two layer circuitized substrate is capable of providing a more complex, higher performance electronic packaging structure than may be possible with a single layer circuitized substrate.

Also, it should be noted that all of the foregoing processing of forming the two layer circuitized polyimide flexible film substrate on the tape 14 as shown in FIG. 6 may be done by handling the tape 14 in a continuous tape format using automated equipment having sprockets for engaging the perforations 16 in the tape 14. Thus, the foregoing processing is especially suited for use in a relatively high volume manufacturing environment. In addition, electronic devices may be mounted on the circuitized substrates, and the circuitized substrates may be attached to other structures by handling the tape 14 in a continuous tape format using automated equipment having sprockets for engaging the perforations 16 in the tape 14. This also is a feature which provides an important advantage especially in a relatively high volume manufacturing environment.

Of course, the foregoing description is directed to one particular embodiment of the present invention and various modifications and other embodiments of the present invention will be apparent to one of ordinary skill in the art to which the present invention pertains. Therefore, it is to be understood that these various modifications and other embodiments of the present invention may be made without departing from the scope of the present invention as described herein and as claimed in the appended claims.

What is claimed is:

1. An assembly for handling circuitized flexible film substrates in a continuous tape format comprising:
    a length of tape having a plurality of window-like openings;
    a flexible, continuous layer of polyimide attached to one side of the tape and spanning each of the window-like openings in the tape; and
    circuitry formed on at least one side of the polyimide layer spanning the window-like openings in the tape.

2. An assembly as recited in claim 1 wherein said length of tape includes perforations designed to engage sprockets on equipment for handling the tape.

3. An assembly as recited in claim 1 wherein said length of tape includes a series of perforations along each edge of the tape designed to engage sprockets on equipment for handling the tape, and wherein the window-like openings in the tape comprise a series of centrally located openings.

4. An assembly as recited in claim 1 wherein said circuitry comprises:
    a first layer of circuitry formed on one side of the polyimide layer spanning one the window-like openings in the tape; and
    a second layer of circuitry formed on the opposite side of the polyimide layer spanning said one window-like opening in the tape.

5. An assembly as recited in claim 4 wherein said circuitry further comprises:
    vias in the polyimide layer spanning said one window-like opening in the tape for providing an elctrical path between the first and the second layers of circuitry.

6. An assembly as recited in claim 1 further comprising:
    an adhesive material on the side of the tape facing the polyimide layer for attaching the polyimide layer to the tape.

7. An assembly as recited in claim 6 wherein said adhesive material comprises a thermo plastic non-condensation polymer polyimide and said polyimide layer comprises a thermo set condensation polymer polyimide.

8. A method for making a circuitized flexible film substrate comprising the steps of:
    coating one side of a carrier foil with uncured polyimide;
    drying the polyimide on the carrier foil to partially cure the polyimide;
    coating one side of a tape with an adhesive material, said tape having at least one window-like opening;
    laminating the tape together with the carrier foil, with the polyimide coated side of the carrier foil facing the adhesive coated side of the tape;
    removing the carrier foil to leave the tape with a relatively thin continuous layer of polyimide spanning the window-like opening in the tape;
    fully curing the polyimide on the tape; and
    circuitizing the polyimide layer spanning the window-like opening in the tape.

9. The method as recited in claim 8 further comprising the step of:
    forming perforations in the tape for engaging sprockets of equipment for handling the tape.

10. The method as recited in claim 8 further comprising the step of:
cutting out from the tape the circuitized polyimide layer spanning the window-like opening in the tape.

11. The method as recited in claim 8 wherein the polyimide coating on the carrier foil comprises a thermo set condensation polymer polyimide, and wherein the adhesive material on the tape comprises a thermo plastic non-condensation polymer polyimide.

12. The method as recited in claim 8 further comprising the step of:
mounting an electronic device on the circuitry of the polyimide layer spanning the window-like opening in the tape.

13. The method as recited in claim 12 wherein said electronic device comprises a semiconductor chip.

14. The method as recited in claim 8 wherein the step of circuitizing the polyimide spanning the window-like opening in the tape comprises:
depositing metal on the polyimide layer;
applying photoresist to the deposited metal;
exposing and developing the photoresist to leave a desired pattern of photoresist on the metal; and
removing the metal not protected by the photoresist.

15. The method as recited in claim 14 wherein the step of depositing metal comprises depositing successive layers of chromium, copper, and chromium.

16. The method as recited in claim 8 wherein the step of circuitizing comprises:
forming a first layer of circuitry on one side of the polyimide spanning the window-like opening in the tape;
applying a second layer of uncured polyimide to the first layer of circuitry;
partially curing the second layer of polyimide;
forming openings in the partially cured, second layer of polyimide;
fully curing the second layer of polyimide;
forming a second layer of circuitry on the fully cured, second layer of polyimide; and
removing the first layer of polyimide spanning the window-like opening in the tape.

17. The method as recited in claim 16 wherein the step of removing the first layer of polyimide spanning the window-like opening in the tape, comprises:
applying a layer of protective material over the second layer of circuitry;
plasma etching away the first layer of polyimide; and
removing the protective material from the second layer of circuitry.

18. The method as recited in claim 16 wherein each of the steps of forming a first and a second layer of circuitry comprises:
depositing metal on the polyimide layer;
applying photoresist to the deposited metal;
exposing and developing the photoresist to leave a desired pattern of photoresist on the metal; and
removing the metal not protected by the photoresist.

19. The method as recited in claim 18 wherein the step of depositing metal comprises depositing successive layers of chromium, copper, and chromium.

* * * * *